US012780650B2

(12) United States Patent
Chang et al.

(10) Patent No.: US 12,780,650 B2
(45) Date of Patent: Nov. 3, 2026

(54) ELECTRONIC DEVICE

(71) Applicant: Merry Electronics(Shenzhen) Co., Ltd., ShenZhen (CN)

(72) Inventors: Yung-Hsiang Chang, Taichung (TW); Yueh-Kang Lee, Taichung (TW); Jia Yin Wu, Taichung (TW)

(73) Assignee: Merry ELectronics(Shenzhen) Co., Ltd., ShenZhen (CN)

( * ) Notice: Subject to any disclaimer, the term of this patent is extended or adjusted under 35 U.S.C. 154(b) by 368 days.

(21) Appl. No.: 18/419,447

(22) Filed: Jan. 22, 2024

(65) Prior Publication Data

US 2025/0206599 A1 Jun. 26, 2025

(30) Foreign Application Priority Data

Dec. 20, 2023 (TW) ................................ 112149743

(51) Int. Cl.
*B81B 7/00* (2006.01)

(52) U.S. Cl.
CPC .... *B81B 7/0061* (2013.01); *B81B 2203/0127* (2013.01); *B81B 2203/0315* (2013.01); *B81B 2207/012* (2013.01)

(58) Field of Classification Search
None
See application file for complete search history.

(56) References Cited

U.S. PATENT DOCUMENTS 8,989,422 B2 * 3/2015 Tanaka .................. H04R 19/04 381/175
11,572,157 B2 * 2/2023 Itoyama ................ G01L 19/143
2022/0369025 A1 * 11/2022 Neumaier ............ H04R 1/2846
2025/0212348 A1 * 6/2025 Chang ....................... B81B 3/00

* cited by examiner

*Primary Examiner* — Long Pham
(74) *Attorney, Agent, or Firm* — JCIPRNET

(57) ABSTRACT

An electronic device includes a first substrate, a second substrate, a sensor, a lid, a water proof member, and an outer cover. The first substrate includes a first inner cavity and a through hole. The second substrate is stacked on the first substrate so as to form a second inner cavity and a straight airflow channel. The sensor is disposed on the first substrate, covers the through hole, and includes a back cavity. The lid is disposed on the second substrate, covers the second inner cavity, and includes an opening. The water proof member covers the opening. The outer cover is disposed on the lid and forms a drainage chamber with the lid. The outer cover includes a first hole and a second hole connecting the drainage chamber to the outside. The first hole and the second hole are staggered from the opening.

7 Claims, 4 Drawing Sheets

ELECTRONIC DEVICE

CROSS-REFERENCE TO RELATED APPLICATION

This application claims the priority benefit of Taiwan application serial no. 112149743, filed on Dec. 20, 2023. The entirety of the above-mentioned patent application is hereby incorporated by reference herein and made a part of this specification.

BACKGROUND

Technical Field

This disclosure relates to an electronic device, and in particular to an electronic device having a drainage chamber.

Description of Related Art

Common electronic devices (e.g., devices with microphones or pressure sensors) usually have openings in the outer casing to connect the air inside the cavity with the outside. In addition, the openings are provided with a water proof member to prevent dust or water droplets from entering the cavity of the electronic device. However, when the electronic device is subjected to strong water flow, the water proof member cannot completely block the high pressure of the water flow, so that part of the water flow will enter the cavity through the openings, which in turn affects the operation of the electronic device. How to prevent water from entering the cavity is one of the research objectives of the researchers in this field.

SUMMARY

The disclosure provides an electronic device, a lid of which may reduce the probability of water from the outside entering the inside of a first inner cavity or a second inner cavity.

An electronic device of the disclosure includes a first substrate, a second substrate, a sensor, a lid, a water proof member, and an outer cover. The first substrate includes a first inner cavity and a through hole connected to the first inner cavity. The second substrate is stacked on the first substrate so as to form a second inner cavity and a straight airflow channel connected to the first inner cavity. The sensor is disposed on the first substrate and covers the through hole. The sensor has a back cavity. The lid is disposed on the second substrate and covers the second inner cavity. The lid includes an opening. The water proof member covers the opening. The outer cover is disposed on the lid and forms a drainage chamber with the lid. The outer cover includes a first hole and a second hole connecting the drainage chamber to the outside. The first hole and the second hole are staggered from the opening.

In an embodiment of the disclosure, the second inner cavity and the straight airflow channel are disposed horizontally on the first inner cavity, and the lid extends to cover the straight airflow channel.

In an embodiment of the disclosure, the opening is correspondingly disposed on the second inner cavity.

In an embodiment of the disclosure, the opening is correspondingly disposed on a straight airflow channel.

In an embodiment of the disclosure, the first inner cavity and the second inner cavity are both located within a range of a vertical projection of the drainage chamber to the first substrate, and the second inner cavity is sandwiched between the first inner cavity and the drainage chamber.

In an embodiment of the disclosure, the drainage chamber includes a lateral drainage channel, and the water proof member is located on the lateral drainage channel.

In an embodiment of the disclosure, a distance between the lid and an outer cover top wall is between 0.1 to 1 mm.

In an embodiment of the disclosure, the opening, the first hole, and the second hole face the same direction.

In an embodiment of the disclosure, the first substrate includes a bottom layer and a top layer, and the through hole is formed on the top layer and connected to the back cavity.

In an embodiment of the disclosure, the first inner cavity includes a lateral airflow channel formed between the bottom layer and the top layer, and air in the back cavity circulates to the straight airflow channel through the lateral airflow channel.

In an embodiment of the disclosure, the first substrate includes multiple inner supports located in the first inner cavity and connected to the bottom layer and the top layer.

In an embodiment of the disclosure, each of the first hole and the second hole has a hole diameter greater than 50 microns.

An electronic device of the disclosure includes a first substrate, a second substrate, a sensor, a lid, and an outer cover. The first substrate includes a first inner cavity and a through hole connected to the first inner cavity. The second substrate is stacked on the first substrate so as to form a second inner cavity. The sensor is disposed on the first substrate and covers the through hole. The sensor has a back cavity. The lid is disposed on the second substrate and covers the second inner cavity. The outer cover is disposed on the lid and includes an outer cover top wall and an outer cover side wall, in which the outer cover top wall is spaced apart from the lid to form a lateral drainage channel. The outer cover side wall is spaced apart from the second substrate to form a straight drainage channel, in which the lateral drainage channel and the straight drainage channel jointly define a drainage chamber. The outer cover includes a first hole and a second hole connecting the drainage chamber to the outside.

In an embodiment of the disclosure, the lid includes an opening and a water proof member covering the opening, and the first hole and the second hole are staggered from the opening.

In an embodiment of the disclosure, the first substrate includes an opening connected to the first inner cavity and a water proof member covering the opening.

In an embodiment of the disclosure, the first hole and the second hole face the same direction and are jointly disposed on the lateral drainage channel.

In an embodiment of the disclosure, the first hole and the second hole face different directions and are respectively provided on the lateral drainage channel and the straight drainage channel.

In an embodiment of the disclosure, the second inner cavity and the straight drainage channel are disposed horizontally on the first substrate.

Based on the above, the outer cover of the electronic device of the disclosure is disposed on the lid, and the outer cover has a first hole and a second hole. The first hole and the second hole are staggered from the opening. In this way, when a high-pressure water flow strikes the outer cover, the water proof member will not be directly damaged by the high-pressure water flow, which in turn reduces the probability of high-pressure water flow entering the inside of the first inner cavity or the second inner cavity through the opening.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
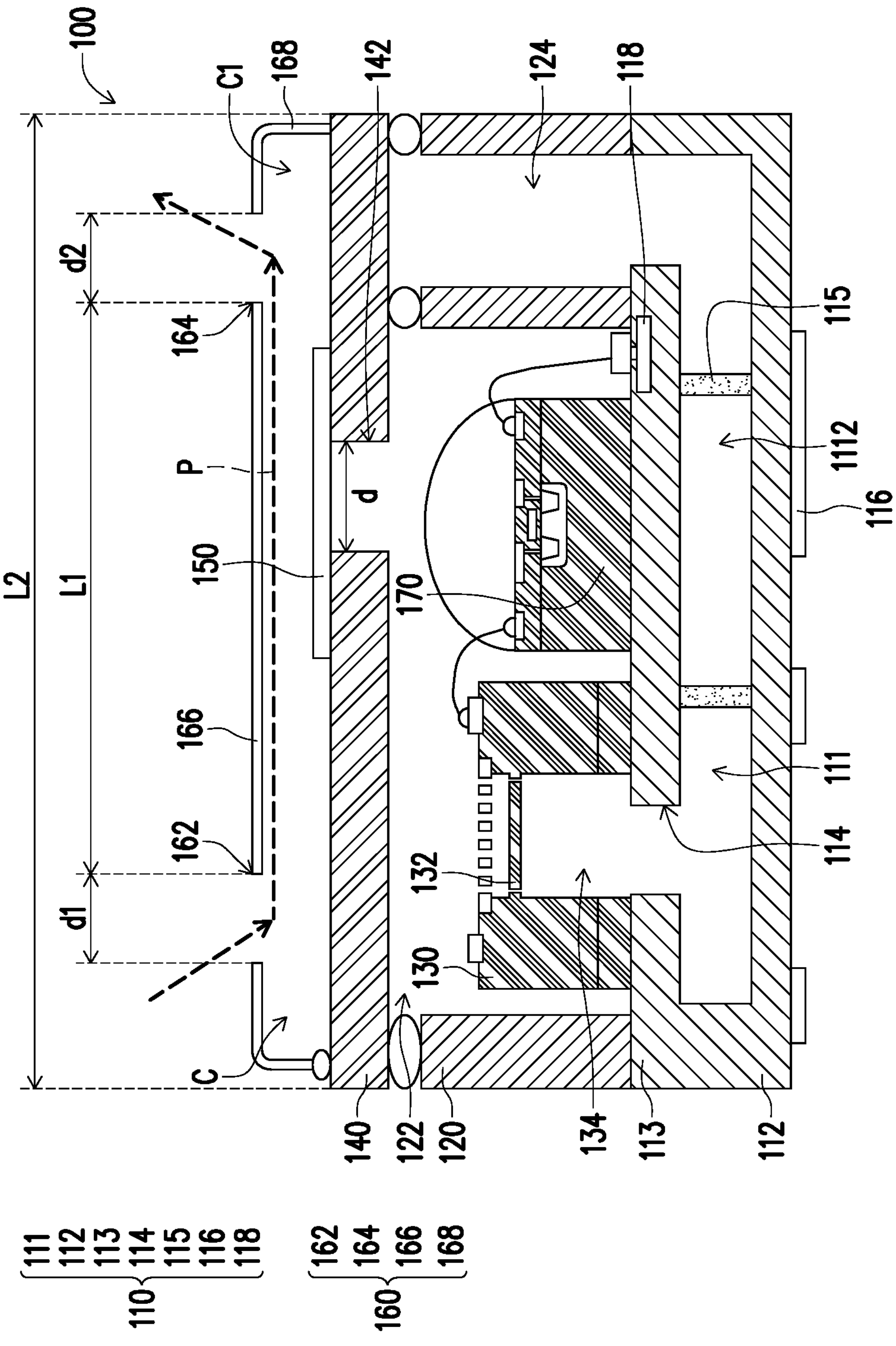
FIG. 1 is a schematic cross-sectional view of an electronic device according to a first embodiment of the disclosure.

FIG. 1 is a schematic cross-sectional view of an electronic device according to a first embodiment of the disclosure. Please refer to FIG. 1, an electronic device 100 in this embodiment is, for example, a microphone device or a pressure sensor, but the disclosure does not limit the type of the electronic device 100.

The electronic device 100 of this embodiment includes a first substrate 110, a second substrate 120, and a sensor 130. The first substrate 110 includes a first inner cavity 111. The second substrate 120 is stacked on the first substrate 110 so as to form a second inner cavity 122. The sensor 130 is disposed on the first substrate 110 and located in the second inner cavity 122, and the sensor 130 has a back cavity 134.

Specifically, the second substrate 120 includes a straight airflow channel 124 connected to and perpendicular to the first inner cavity 111. The second inner cavity 122 and the straight airflow channel 124 are disposed horizontally on the first inner cavity 111, and the straight airflow channel 124 is located on a side of the second inner cavity 122.

Furthermore, the first substrate 110 of this embodiment includes a bottom layer 112, a top layer 113, and a through hole 114 formed on the top layer 113. The first inner cavity 111 is located between the bottom layer 112 and the top layer 113, and the top layer 113 is located between the second inner cavity 122 and the first inner cavity 111. The sensor 130 covers the through hole 114, and the through hole 114 is connected to the first inner cavity 111 and the back cavity 134. That is, the first inner cavity 111 is connected to the back cavity 134 through the through hole 114.

The first inner cavity 111 formed by the bottom layer 112 and the top layer 113 is connected to the back cavity 134, so that the first inner cavity 111 serves as a part of the cavity of the sensor 130, and so that the sensor 130 has a larger cavity. In this way, the sensor 130 may effectively improve the performance of acoustic signal-to-noise ratio.

Specifically, in this embodiment, the sensor 130 includes, for example, a MEMS chip. The MEMS chip may be used in microphones, bone conduction vibration sensors, barometers, etc., but the type of the sensor 130 is not limited thereto. The sensor 130 includes a membrane 132, and the sensor 130 may convert the deformation generated by the membrane 132 into an electrical signal.

In addition, a control chip 170 is disposed on the first substrate 110 and located in the second inner cavity 122. The control chip 170 is electrically connected to the sensor 130 and the first substrate 110. In detail, the sensor 130 is connected to the control chip 170 through wire bonding, for example, and the control chip 170 is connected to an internal circuit layer 118 of the first substrate 110 through wire bonding, for example. The control chip 170 is, for example, an ASIC chip, but the disclosure is not limited thereto.

In addition, the first inner cavity 111 includes a lateral airflow channel 1112. The lateral airflow channel 1112 is formed between the bottom layer 112 and the top layer 113, and air in the back cavity 134 circulates to the straight airflow channel 124 through the lateral airflow channel 1112. The design of the extended airflow channel allows the back cavity of the sensor 130 to be enlarged.

In this embodiment, the first substrate 110 includes multiple inner supports 115 (two are shown) located in the first inner cavity 111 and connected to the bottom layer 112 and the top layer 113. The inner support 115 may enhance the overall rigidity of the first substrate 110.

The electronic device 100 of this embodiment includes a lid 140 and a water proof member 150. The lid 140 is disposed on the second substrate 120 and covers the second inner cavity 122, and the lid 140 includes an opening 142. The water proof member 150 covers the opening 142 to prevent water or dust from the outside from entering the second inner cavity 122, thus preventing the sensing performance of the sensor 130 from being affected. The lid 140 may be a metal cover or a printed circuit board, and the disclosure is not limited thereto.

In this embodiment, the lid 140 extends from the second inner cavity 122 to cover the straight airflow channel 124, the opening 142 is disposed on the lid 140, and the opening 142 is correspondingly disposed on the second inner cavity 122. That is, external air pressure (such as sound pressure) will enter the second inner cavity 122 from the opening 142, causing the membrane 132 of the sensor 130 to be pressurized and deformed.

The electronic device 100 of this embodiment includes an outer cover 160. The outer cover 160 is disposed on the lid 140 and forms a drainage chamber C with the lid 140. The drainage chamber C includes a lateral drainage channel C1, and the water proof member 150 is located on the lateral drainage channel C1. The first inner cavity 111 and the second inner cavity 122 are both located within a range of a vertical projection of the drainage chamber C to the first substrate 110, and the second inner cavity 122 is sandwiched between the first inner cavity 111 and the drainage chamber C.

In this embodiment, the outer cover 160 includes a first hole 162 and a second hole 164 connecting the drainage chamber C to the outside. A portion of the drainage chamber C between the first hole 162 and the second hole 164 serves as a drainage channel P, and the water proof member 150 is located on the drainage channel P.

In addition, the first hole 162 and the second hole 164 are, for example, disposed on an outer cover top wall 166 of the outer cover 160. In other embodiments, one of the first hole 162 and the second hole 164 may be disposed on an outer cover side wall 168, or both the first hole 162 and the second hole 164 may be disposed on the outer cover side wall 168. The disclosure is not limited thereto.

As shown in FIG. 1, when the water flow strikes the outer cover 160, the first hole 162 serves as a water inlet hole, and the second hole 164 serves as a drainage hole, for example. The water flow is adapted to enter through the water inlet hole (for example, the first hole 162) and flow along the drainage channel P, and then the water flow is discharged to the outside through the drainage hole (for example, the second hole 164). Of course, the first hole 162 and the second hole 164 may also be drainage hole and water inlet hole respectively to exclude the water flow entering the drainage channel P.

In this embodiment, the first hole 162 and the second hole 164 are staggered from the opening 142. When the higher-pressure water flow strikes the outer cover 160, since the first hole 162 and the second hole 164 are staggered from the opening 142, the water proof member 150 will not be directly damaged by the high-pressure water flow, and may reduce the probability of water flow entering the inside of the second inner cavity 122 through the opening 142.

In addition, the double-hole design of the outer cover 160 with the water inlet hole and the drainage hole (i.e., the first hole 162 and the second hole 164) may release the dynamic water pressure of the water flow, and also enable the water flow in the drainage chamber C to maintain a pressure balance, so that the water flow may be smoothly discharged from the drainage hole to the outside.

The outer cover 160 of this embodiment defines a flow channel path of the drainage channel P between a vertical projection of the first hole 162 to the drainage chamber C and a vertical projection of the second hole 164 to the drainage chamber C. A length L1 of the flow channel path of the drainage channel P is greater than a hole diameter d of the opening 142, the length L1 of the drainage channel P is greater than or equal to more than half of a length L2 of the lid 140, and the length L1 of the drainage channel P is more than 0.2 times the length L2 of the lid 140. In addition, in this embodiment, there is a distance between the lid 140 and the outer cover top wall 166 between 0.1 to 1 mm. The above design may ensure a certain flow channel path. When the high-pressure water flow enters the drainage chamber C, the dynamic water pressure may be released to a certain extent to avoid the water flow pressure in the drainage chamber C is too large and lead to the water proof member 150 damage.

In addition, the first substrate 110 of this embodiment further includes multiple electrode layers 116 located on the other side of the first substrate 110 opposite to the outer cover 160. The electronic device 100 of this embodiment may be electrically connected to and disposed on other devices (such as a vehicle body) through the electrode layer 116. The electronic device 100 of this embodiment is adapted to be disposed in other devices through the electrode layer 116 in an inverted manner (i.e., turn FIG. 1 upside-down). At this time, the first hole 162 and the second hole 164 are located at the lower part of the overall electronic device 100. Such an arrangement allows the water flow in the drainage chamber C to be moved downward by gravity, so that the water flow may be quickly discharged to the outside from the first hole 162 or the second hole 164 at the lower part.

It should be noted that the opening 142, the first hole 162, and the second hole 164 of this embodiment face the same direction (for example, the up and down direction in FIG. 1). Such a design may help external sounds to enter the first inner cavity 111, the back cavity 134, and the second inner cavity 122 smoothly from the first hole 162, the second hole 164, and the opening 142. In other embodiments, the opening 142, the first hole 162, and the second hole 164 may also face different directions, and the disclosure is not limited thereto.

In addition, a hole diameter d1 and a hole diameter d2 of each of the first hole 162 and the second hole 164 are greater than 50 microns to ensure the acoustic properties of the sound are not affected when the sound enters the first inner cavity 111, the back cavity 134, and the straight airflow channel 124 from the first hole 162, the second hole 164, and the opening 142. Specifically, the hole diameter d1 and the hole diameter d2 of the each of the first hole 162 and the second hole 164 are greater than 50 microns, which may effectively avoid the electronic device 100 from generating a resonance frequency in the audible frequency (between 20 Hz and 20 kHz) range, and may avoid the electronic device 100 from generating a sharp sound, which may in turn avoid affecting the experience of use of the user.

It should be added that the disclosure does not limit the number of holes disposed on the outer cover 160, as long as the number of holes disposed on the outer cover 160 is greater than two, so that the water flow may smoothly enter and leave the drainage chamber C, and all holes are staggered from the opening 142. However, when the number of holes disposed on the outer cover 160 increases, the amount of dust entering the drainage chamber C will also increase, so the number of holes on the outer cover 160 should not be too many either.

Figure 2:
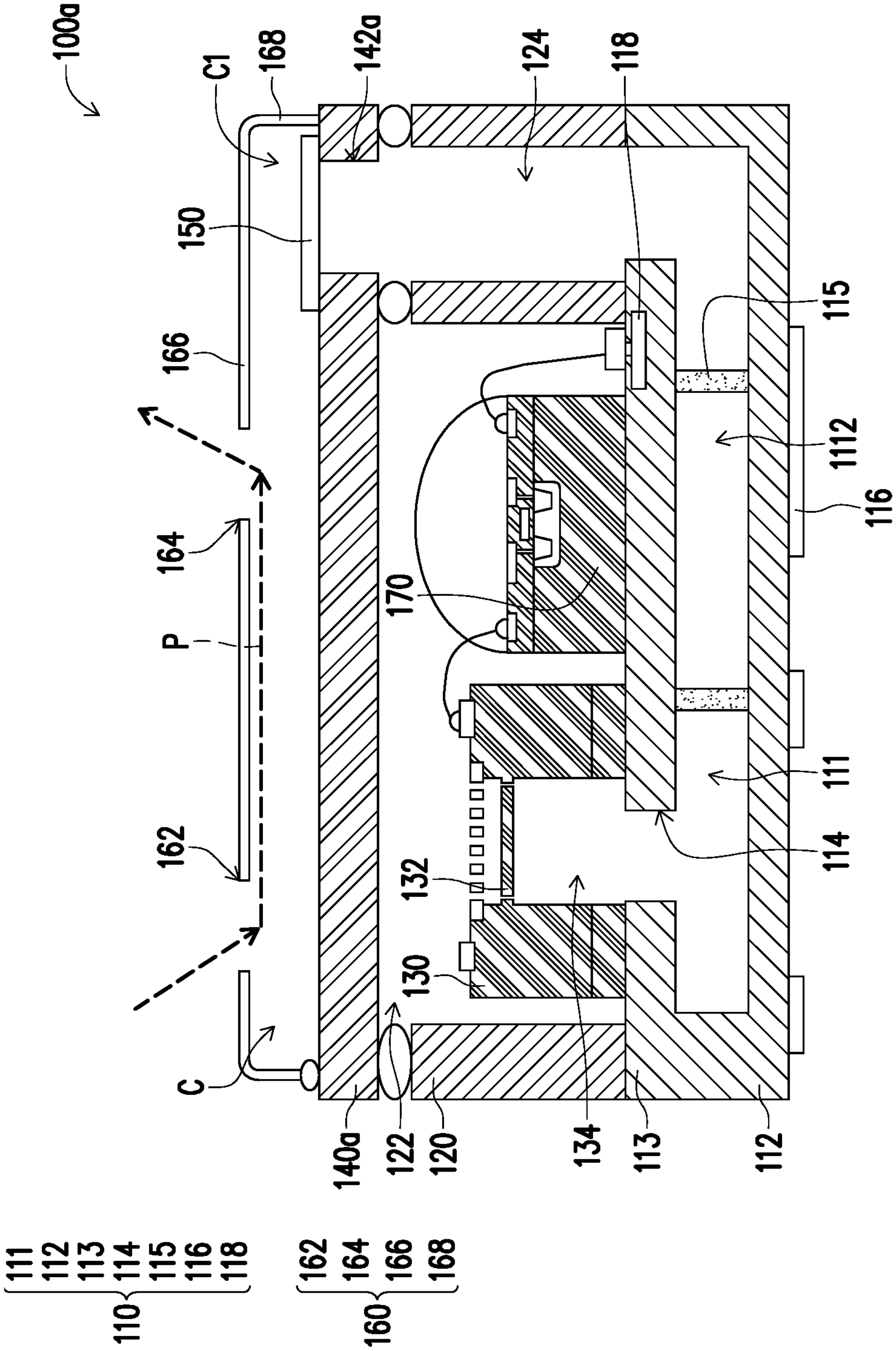
FIG. 2 is a schematic cross-sectional view of an electronic device according to a second embodiment of the disclosure.

FIG. 2 is a schematic cross-sectional view of an electronic device according to a second embodiment of the disclosure. Please refer to FIG. 2. The main difference between an electronic device 100*a* of this embodiment and the electronic device 100 of FIG. 1 is that in this embodiment, a lid 140*a* extends to cover the straight airflow channel 124. An opening 142*a* is correspondingly disposed on the straight airflow channel 124 and connected to the straight airflow channel 124 and the drainage chamber C, and the water proof member 150 is located between the straight airflow channel 124 and the drainage chamber C.

Specifically, as shown in FIG. 2, the lid 140*a* may be partially located on the straight airflow channel 124, and the opening 142*a* on the lid 140*a* is aligned with the straight airflow channel 124. The external sound will enter the drainage chamber C from the first hole 162 or the second hole 164, and then pass through the opening 142*a*, the straight airflow channel 124, the first inner cavity 111, and the back cavity 134 of the sensor 130 in sequence, causing the membrane 132 of the sensor 130 to be pressurized and deformed.

In addition, the first hole 162 and the second hole 164 of this embodiment are staggered from the opening 142. The water flow from the outside may enter and leave the drainage chamber C through the first hole 162 and the second hole 164, and the water proof member 150 will not be directly damaged by the high-pressure water flow from the outside, and may reduce the probability of water flow entering the straight airflow channel 124 through the opening 142*a*.

Figure 3:
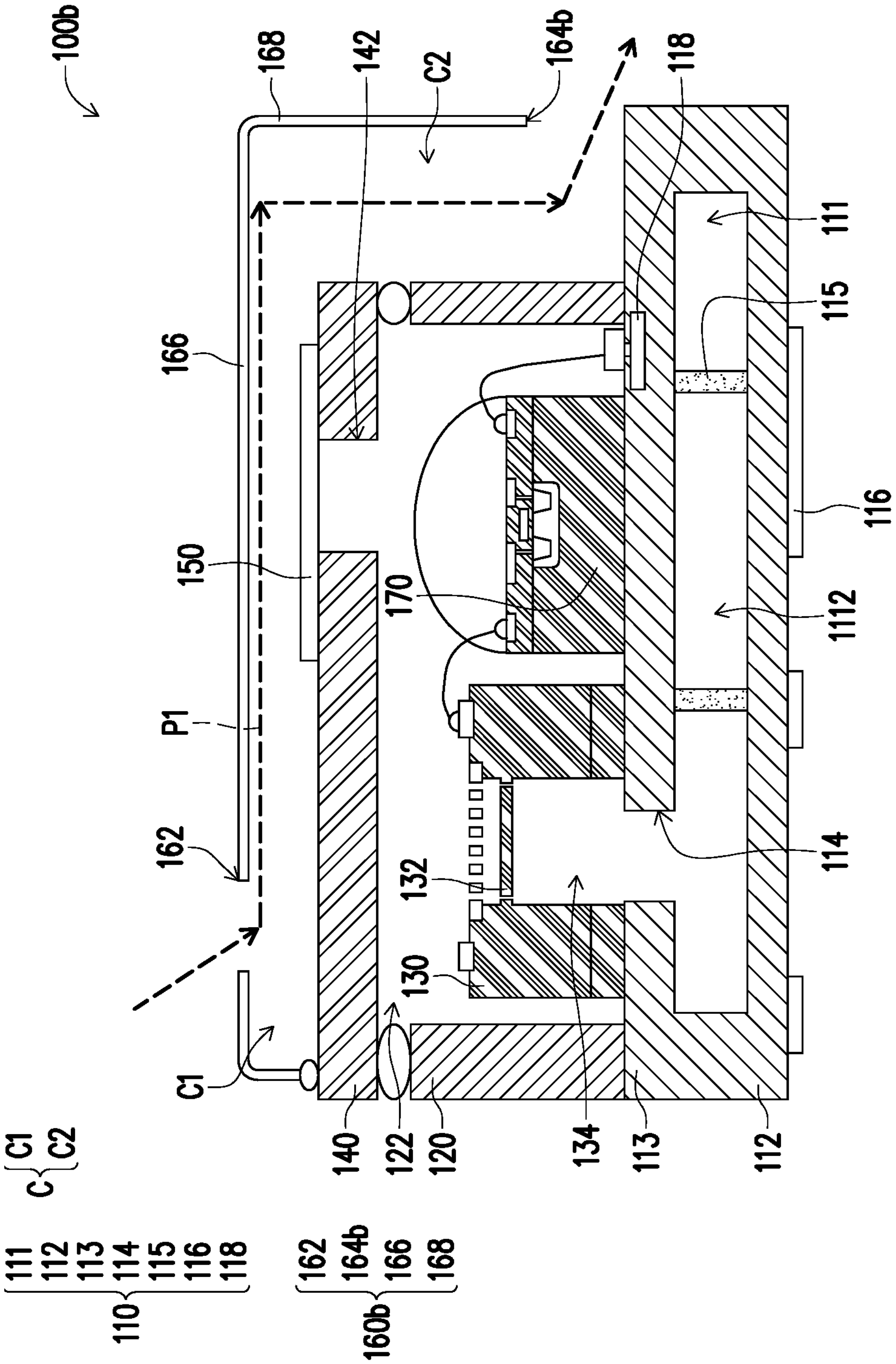
FIG. 3 is a schematic cross-sectional view of an electronic device according to a third embodiment of the disclosure.

FIG. 3 is a schematic cross-sectional view of an electronic device according to a third embodiment of the disclosure. Please refer to FIG. 3. The main difference between an electronic device 100*b* of this embodiment and the electronic device 100 of FIG. 1 is that in this embodiment, the outer cover top wall 166 is spaced apart from the lid 140 form a lateral drainage channel C1, and the outer cover side wall 168 is spaced apart from the second substrate 120 to form a straight drainage channel C2. The mutually perpendicular lateral drainage channel C1 and the straight drainage channel C2 jointly define a drainage chamber C, and the first hole 162 and a second hole 164*b* face different directions.

Specifically, the first hole 162 of this embodiment is disposed on the outer cover top wall 166 of an outer cover 160*b*, and the first hole 162 is disposed on the lateral drainage channel C1. The second hole 164*b* is disposed between the outer cover side wall 168 of the outer cover 160*b* and the first substrate 110, and the second hole 164*b* is disposed on the straight drainage channel C2. In addition, the water proof member 150 is located on the lateral drainage channel C1.

Through such a setup, the drainage channel P1 has a bend, which may further release the dynamic water pressure of the high-pressure water flow entering the drainage chamber C, so as to avoid damage to the water proof member 150 caused by the excessive pressure of the water flow in the drainage chamber C, and to further reduce the probability of water flow entering the second inner cavity 122 from the opening 142.

In addition, the electronic device 100*b* of this embodiment is adapted to be positively disposed on other devices through the electrode layer 116 (i.e., the state in FIG. 3). At this time, the first hole 162 is located at an upper part of the overall electronic device 100*b*, and the second hole 164*b* is located at a lower part of the overall electronic device 100*b*. Such an arrangement allows the water flow in the drainage chamber C to be moved downward by gravity, so that the water flow may be quickly discharged to the outside from the first hole 162 at the upper part to the second hole 164*b* at the lower part.

Figure 4:
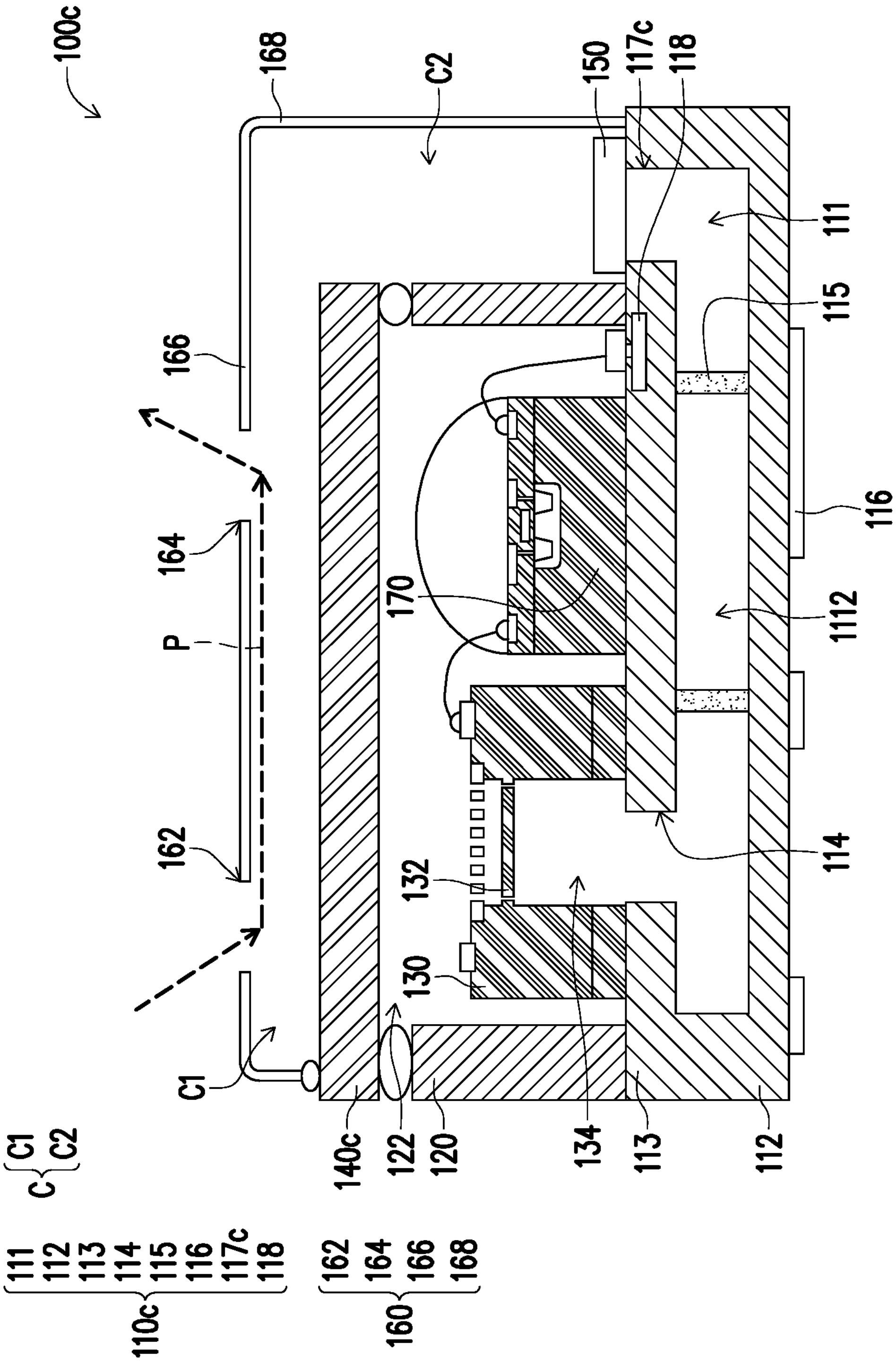
FIG. 4 is a schematic cross-sectional view of an electronic device according to a fourth embodiment of the disclosure.

FIG. 4 is a schematic cross-sectional view of an electronic device according to a fourth embodiment of the disclosure. Please refer to FIG. 4. The main difference between an electronic device 100*c* of this embodiment and the electronic device 100*a* of FIG. 2 is that in this embodiment, a first substrate 110*c* includes an opening 117*c* connected to the first inner cavity 111 and a water proof member 150 covering the opening 117*c*.

Specifically, the drainage chamber C of this embodiment has a lateral drainage channel C1 and a straight drainage channel C2. The first hole 162 and the second hole 164 are both disposed on the lateral drainage channel C1, and the opening 117*c* and the water proof member 150 are located on the straight drainage channel C2. The opening 117*c* is connected to the first inner cavity 111 and the straight drainage channel C2, and the water proof member 150 is located between the first inner cavity 111 and the straight drainage channel C2 and covers the opening 117*c*. In other words, the opening 117*c* in this embodiment is not formed on a lid 140*c*, but on the first substrate 110*c*.

Similar to the electronic device 100*a* of FIG. 2, the first hole 162 and the second hole 164 of this embodiment are staggered from the opening 117*c*. The water flow from the outside may enter and leave the drainage chamber C from the first hole 162 and the second hole 164, and the water proof member 150 will not be directly damaged by the high-pressure water flow from the outside, and may reduce the probability of water flow entering the first inner cavity 111 from the opening 117*c*.

In addition, the external sound will enter the lateral drainage channel C1 from the first hole 162 or the second hole 164, pass through the straight drainage channel C2, the opening 117*c*, the first inner cavity 111, and back cavity 134 of the sensor 130 in sequence, and then enter the second inner cavity 122 through the membrane 132 of the sensor 130.

To sum up, the outer cover of the electronic device of the disclosure is disposed on the lid, and the outer cover has a first hole and a second hole. The first hole and the second hole are staggered from the opening. In this way, when a high-pressure water flow strikes the outer cover, the water proof member will not be directly damaged by the high-pressure water flow, which in turn reduces the probability of high-pressure water flow entering the inside of the first inner cavity or the second inner cavity.

In addition, in the electronic device of the disclosure, the first inner cavity formed by the bottom layer and the top layer is connected to the back cavity, so that the first inner cavity serves as a part of the cavity of the sensor, and so that the sensor has a larger cavity. In this way, the sensor may effectively improve the performance of acoustic signal-to-noise ratio.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:

a first substrate, comprising a first inner cavity and a through hole connected to the first inner cavity;

a second substrate, stacked on the first substrate so as to form a second inner cavity;

a sensor, disposed on the first substrate and covering the through hole, the sensor having a back cavity;

a lid, disposed on the second substrate and covering the second inner cavity, the lid comprising an opening; and an outer cover, disposed on the lid, comprising an outer cover top wall and an outer cover side wall, wherein the outer cover top wall is spaced apart from the lid to form a lateral drainage channel, and the outer cover side wall is spaced apart from the second substrate to form a straight drainage channel, wherein the lateral drainage channel and the straight drainage channel jointly define a drainage chamber, and the outer cover comprises a first hole and a second hole connecting the drainage chamber to the outside.

2. The electronic device according to claim 1, wherein the lid comprises an opening and a water proof member covering the opening, and the first hole and the second hole are staggered from the opening.

3. The electronic device according to claim 1, wherein the first substrate comprises an opening connected to the first inner cavity and a water proof member covering the opening.

4. The electronic device according to claim 1, wherein the first hole and the second hole face the same direction and are jointly disposed on the lateral drainage channel.

5. The electronic device according to claim 1, wherein the first hole and the second hole face different directions and are respectively disposed on the lateral drainage channel and the straight drainage channel.

6. The electronic device according to claim 1, wherein a distance between the lid and an outer cover top wall of the outer cover is between 0.1 to 1 mm.

7. The electronic device according to claim 1, wherein the second inner cavity and the straight drainage channel are disposed horizontally on the first substrate.

* * * * *